United States Patent
Ko et al.

(10) Patent No.: US 11,152,072 B2
(45) Date of Patent: Oct. 19, 2021

(54) MEMORY DEVICE INCLUDING GROUPED PAGE BUFFERS AND READ OPERATION METHOD THEREOF

(71) Applicant: SK hynix Inc., Gyeonggi-do (KR)

(72) Inventors: Jung-Mi Ko, Gyeonggi-do (KR); Ji-Hwan Kim, Seoul (KR); Seong-Je Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/662,900

(22) Filed: Oct. 24, 2019

(65) Prior Publication Data

US 2020/0135282 A1   Apr. 30, 2020

(30) Foreign Application Priority Data

Oct. 24, 2018   (KR) .................. 10-2018-0127380

(51) Int. Cl.

| | |
|---|---|
| *G11C 16/26* | (2006.01) |
| *G06F 12/0882* | (2016.01) |
| *G06F 12/02* | (2006.01) |
| *G11C 16/08* | (2006.01) |
| *G06F 3/06* | (2006.01) |
| *G11C 16/24* | (2006.01) |

(52) U.S. Cl.
CPC ............ *G11C 16/26* (2013.01); *G06F 3/0656* (2013.01); *G06F 3/0688* (2013.01); *G06F 12/0246* (2013.01); *G06F 12/0882* (2013.01); *G11C 16/08* (2013.01); *G11C 16/24* (2013.01)

(58) Field of Classification Search
None
See application file for complete search history.

(56) References Cited

U.S. PATENT DOCUMENTS

| | | | | |
|---|---|---|---|---|
| 5,768,215 | A | * 6/1998 | Kwon | G11C 7/1021 365/238.5 |
| 2003/0031053 | A1 | * 2/2003 | Tsao | G11C 7/1042 365/185.12 |
| 2003/0043628 | A1 | * 3/2003 | Lee | G11C 16/3459 365/185.17 |
| 2006/0044874 | A1 | * 3/2006 | Tokiwa | G11C 16/10 365/185.21 |

(Continued)

FOREIGN PATENT DOCUMENTS

| | | |
|---|---|---|
| KR | 10-2011-0043211 | 4/2011 |
| KR | 10-2013-0072669 | 7/2013 |

*Primary Examiner* — J. H. Hur
(74) *Attorney, Agent, or Firm* — IP & T Group LLP (57) ABSTRACT

A memory device includes a memory cell array including a plurality of memory cells, a plurality of first even page buffers suitable for reading data from first even-numbered memory cells among the plurality of memory cells, and storing the read data, a plurality of first odd page buffers suitable for reading data from first odd-numbered memory cells among the plurality of memory cells, and storing the read data, and a plurality of first cache buffers corresponding to the first even page buffers, suitable for storing data received through a first common node from the first even page buffers, and a plurality of second cache buffers corresponding to the first odd page buffers, and suitable for storing data received through the first common node from the first odd page buffers.

20 Claims, 6 Drawing Sheets

(56) References Cited

U.S. PATENT DOCUMENTS

2012/0331210 A1* 12/2012 Jeong .................. G11C 16/26
 711/103
2013/0166853 A1* 6/2013 Chung ................. G11C 16/26
 711/154

* cited by examiner

MEMORY DEVICE INCLUDING GROUPED PAGE BUFFERS AND READ OPERATION METHOD THEREOF

CROSS-REFERENCE TO RELATED APPLICATION

This application claims priority under 35 U.S.C. § 119 to Korean Patent Application No. 10-2018-0127380 filed on Oct. 24, 2018, which is incorporated herein by reference in its entirety.

BACKGROUND

1. Field

Exemplary embodiments relate to a memory device and a read operation method thereof and, more particularly, to a memory device with reduced time required for a read operation.

2. Discussion of the Related Art

A memory system is applied to various electronic devices for consumer or industrial uses, for example, a computer, a mobile phone, a portable digital assistant (PDA), a digital camera, a game machine and a navigation device. The memory system is used as a main memory device or an auxiliary memory device of a corresponding electronic device. Memory devices which realize a memory system may be classified into a volatile memory device such as a dynamic random access memory (DRAM) and a static RAM (SRAM) and a nonvolatile memory device such as a read only memory (ROM), a mask ROM (MROM), a programmable ROM (PROM), an erasable and programmable ROM (EPROM), an electrically erasable and programmable ROM (EEPROM), a ferroelectric RAM (FRAM), a phase-change RAM (PRAM), a magnetoresistive RAM (MRAM), a resistive RAM (RRAM) and a flash memory.

A volatile memory device cannot preserve data stored therein when power is turned off. In contrast, a nonvolatile memory device can preserve data stored therein even when power is turned off. In particular, because a flash memory has advantages such as high programming speed, low power consumption and large data storage, it is being widely used as a storage medium in a computer system, etc.

A flash memory includes a memory cell array which stores data. The memory cell array is configured by a plurality of memory blocks. Each memory block is configured by a plurality of pages. Each page is configured by a plurality of memory cells which share one word line. The flash memory performs an erase operation on the basis of memory blocks, and performs a read or program operation on the basis of pages.

As the degree of integration of the flash memory increases, the number of memory cells included in one page and the size of each page are gradually increasing. Due to this fact, there may be not only a case of performing a read operation on a single page but also a case of performing a partial read operation on a part of a single page, for example, a half page. Therefore, a method for reducing a time required for the partial read operation has been researched.

SUMMARY

Various embodiments are directed to a memory device capable of storing read data in page buffers and transmitting to input/output lines through different nodes shared by corresponding page buffers, and a read operation method thereof.

In accordance with an embodiment of the present invention, a memory device may include: a memory cell array including a plurality of memory cells; a page buffer circuit suitable for reading data from even-numbered memory cells among the memory cells, during a half page read operation, the page buffer circuit including a plurality of even page buffers which store the data read from the even-numbered memory cells; and a control circuit suitable for controlling a first even page buffer and a second even page buffer of the even page buffers to simultaneously transmit the stored data through nodes which are different from each other.

In accordance with an embodiment of the present invention, a memory device may include: a memory cell array including a plurality of memory cells; a plurality of first even page buffers suitable for reading data from first even-numbered memory cells among the plurality of memory cells, and storing the read data; a plurality of first odd page buffers suitable for reading data from first odd-numbered memory cells among the plurality of memory cells, and storing the read data; a plurality of first cache buffers corresponding to the first even page buffers, and suitable for storing data received through a first common node from the first even page buffers; and a plurality of second cache buffers corresponding to the first odd page buffers, and suitable for storing data received through the first common node from the first odd page buffers.

In accordance with an embodiment of the present invention, a method for operating a memory device may include: reading data through even bit lines among a plurality of bit lines and storing the read data in even page buffers, during a half page read operation; and transmitting data stored in first even page buffers among the even page buffers, and at the same time, transmitting data stored in second even page buffers among the even page buffers.

In accordance with an embodiment of the present invention, a memory device may include: a memory cell array including at least first and second cell groups; first and second buffer groups electrically coupled to the first cell group and electrically coupled to different channels; and a control circuit configured to control the first and second buffer groups to output data of the first cell group through the corresponding channels at the same time.

In accordance with an embodiment of the present invention, an operating method of a memory device may include: buffering data of a first cell group of a memory cell array including at least the first and a second cell groups into first and second buffer groups electrically coupled to different channels; and outputting the buffered data of the first cell group through the corresponding channels at the same time.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
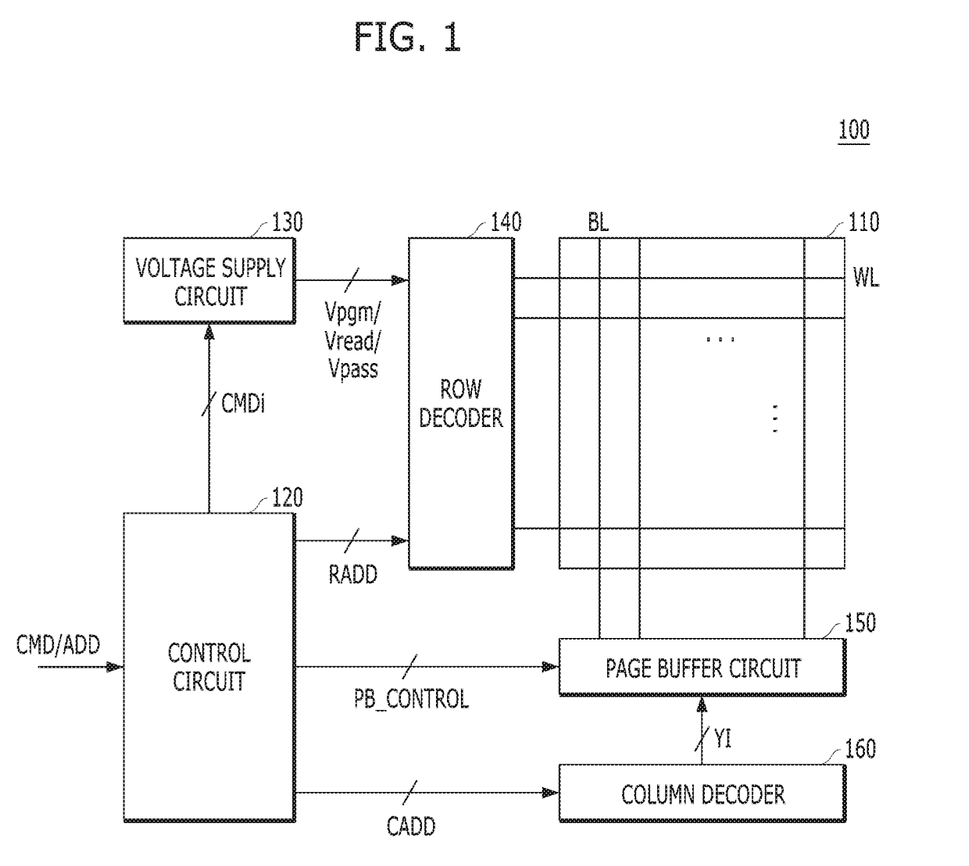
FIG. 1 is a block diagram illustrating a memory device in accordance with an embodiment of the disclosure.

FIG. 1 is a diagram illustrating a memory device 100 in accordance with an embodiment of the disclosure. Referring to FIG. 1, the memory device 100 may include a memory cell array 110 which includes a plurality of memory cells, and operation circuits for performing operations (e.g., a program operation, a read operation and an erase operation) for the plurality of memory cells.

The operation circuits may include a control circuit 120, a voltage supply circuit 130, a row decoder 140, a page buffer circuit 150 and a column decoder 160. The control circuit 120 may control the voltage supply circuit 130, the row decoder 140, the page buffer circuit 150 and the column decoder 160 to perform a program operation, a read operation and an erase operation, in response to a command CMD and an address ADD inputted from an exterior.

The control circuit 120 may generate an internal command signal CMDi and a page buffer control signal PB_CONTROL for performing a program operation, a read operation and an erase operation, in response to the command CMD inputted through an input/output circuit (not shown). Also, the control circuit 120 may generate a row address signal RADD and a column address signal CADD in response to the address ADD inputted through the input/output circuit.

The voltage supply circuit 130 may generate operation voltages, for example, a program voltage Vpgm, a read voltage Vread and a pass voltage Vpass, which are necessary for a program operation and a read operation for memory cells, in response to the internal command signal CMDi generated by the control circuit 120. The row decoder 140 may supply the operation voltages Vpgm, Vread and Vpass to word lines WL of selected memory cells, in response to the row address RADD generated by the control circuit 120.

The page buffer circuit 150 may operate as a sense amplifier or a write driver depending on an operation mode. That is, in a read operation, the page buffer circuit 150 may sense and amplify the voltages of bit lines BL to read data from memory cells. In a program operation, the page buffer circuit 150 may drive the voltages of bit lines BL depending on inputted data, to program the data in memory cells.

To this end, the page buffer circuit 150 may include a plurality of page buffers which are coupled with the memory cell array 110 through bit lines BL. The page buffers may operate in response to the page buffer control signal PB_CONTROL generated by the control circuit 120. The configuration and operation of the page buffers will be described in detail with reference to FIGS. 3 and 4.

The column decoder 160 may generate a column select signal YI for selecting page buffers included in the page buffer circuit 150, in response to the column address CADD generated by the control circuit 120. In a read operation, page buffers may be sequentially selected by the column select signal YI, and data read from memory cells and stored in the page buffers may be outputted to the input/output circuit through the column decoder 160. In a program operation, data to be stored in memory cells may be received from the input/output circuit and sequentially transferred to page buffers in response to the column select signal YI.

Figure 2:
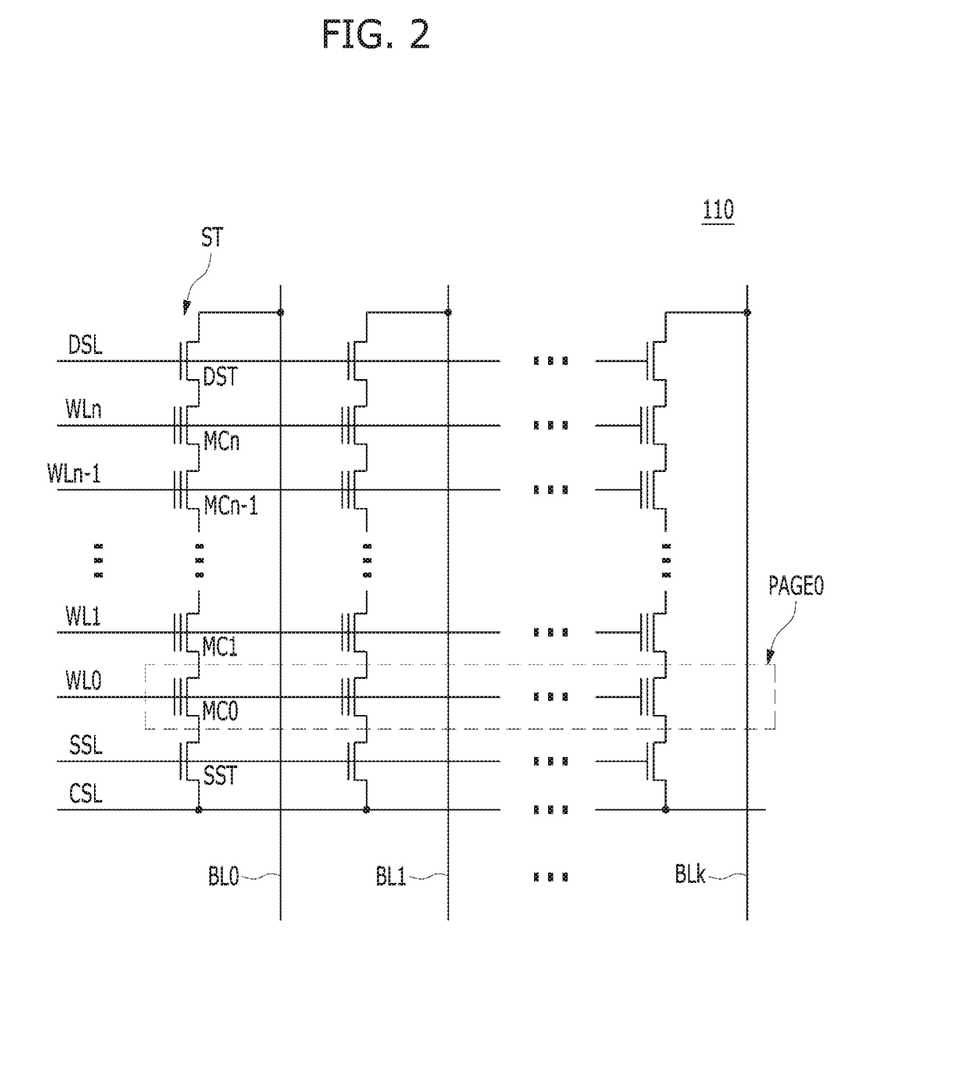
FIG. 2 is a circuit diagram illustrating a memory cell array illustrated in FIG. 1.

FIG. 2 is a circuit diagram illustrating the memory cell array 110 illustrated in FIG. 1.

Referring to FIG. 2, the memory cell array 110 may include a plurality of cell strings ST which are coupled to bit lines BL0 to BLk, respectively. The cell string ST of each column may include at least one drain select transistor DST and at least one source select transistor SST. A plurality of memory cells, that is, memory cell transistors MC0 to MCn, may be coupled in series between the select transistors DST and SST. The respective memory cells MC0 to MCn may be configured by multi-level cells (MLC) each of which stores data information of a plurality of bits.

The cell strings ST may be electrically coupled between the corresponding bit lines BL0 to BLk and a common source line CSL. The gate of the source select transistor SST may be coupled to a source select line SSL, the gates of the memory cells MC0 to MCn may be coupled to word lines WL0 to WLn, respectively, and the gate of the drain select transistor DST may be coupled to a drain select line DSL.

The memory cells MC0 to MCn included in the memory cell array 110 may be identified as physical page units or logical page units. For example, memory cells MC0 which are coupled to one word line WL0 may configure one physical page PAGE0. Further, one physical page PAGE0 may be divided into an even page which is configured by even-numbered memory cells and an odd page which is configured by odd-numbered memory cells. Thus, a program operation or a read operation may be performed in the memory cell array 110 by the basic unit of page or by the basic unit of even page or odd page.

Various embodiments are directed to a partial read operation on a part of a single page, for example, a half page read operation on a half page. Even though the half page read operation is described in the specification as an example, it will be apparent to those skilled in the art that the half page read operation is a representative example of the partial read operation and that various changes and modifications of the half page read operation and other partial read operation such as a quarter page read operation on a half of a half page may be made without departing from the spirit and scope of the invention. In various embodiments, when a single page may include memory cells, which are coupled between a word line WL and 8 bit lines BL0 to BL7, the half page read operation may be performed on half pages of the single page, e.g., even-numbered memory cells, which are coupled between the word line WL and 4 bit lines BL0, BL2, BL4 and BL6, and odd-numbered memory cells, which are coupled between the word line WL and 4 bit lines BL1, BL3, BL5 and BL7. In alternative embodiment, the quarter page read operation may be performed on quarter pages of the single page, e.g., half memory cells of even-numbered memory cells, which are coupled between the word line WL and 2 bit lines BL0 and BL4, half memory cells of odd-numbered memory cells, which are coupled between the word line WL and 2 bit lines BL1 and BL5, half memory cells of even-numbered memory cells, which are coupled between the word line WL and 2 bit lines BL2 and BL6, half memory cells of odd-numbered memory cells, which are coupled between the word line WL and 2 bit lines BL3 and BL7.

Figure 3:
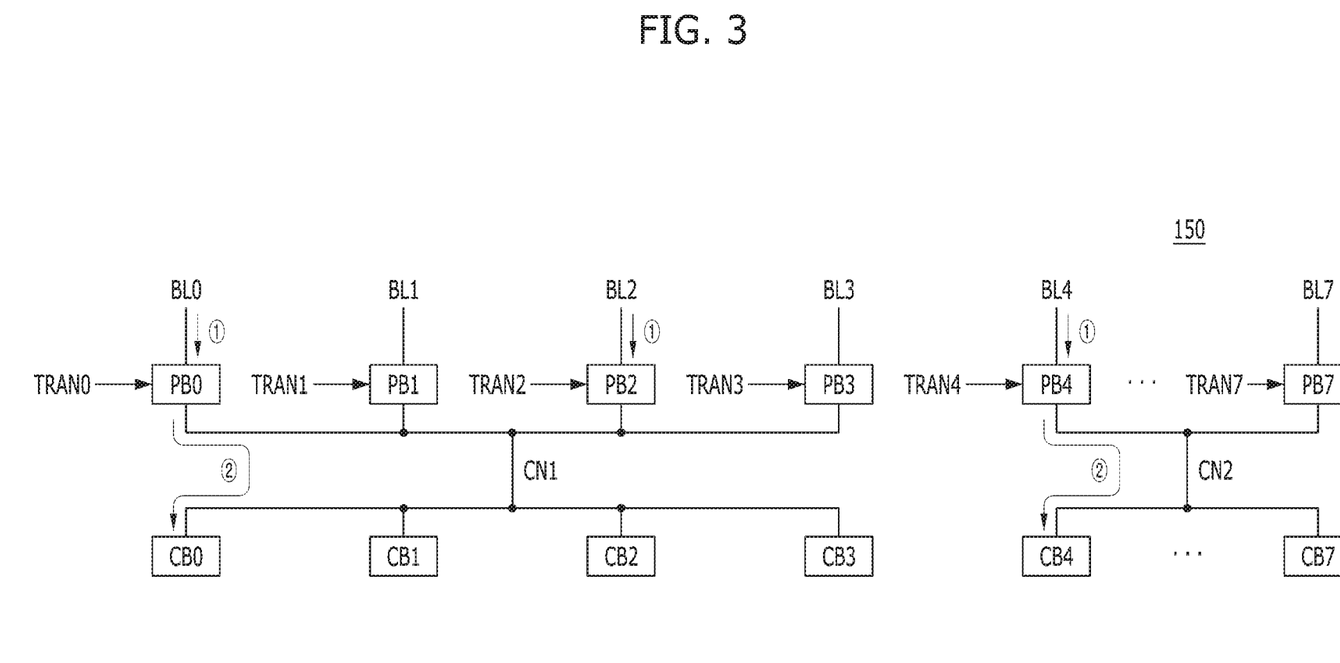
FIG. 3 is a block diagram illustrating a page buffer circuit illustrated in FIG. 1.

FIG. 3 is a block diagram illustrating the page buffer circuit 150 illustrated in FIG. 1.

The page buffer circuit 150 may perform a half page read operation by reading data from even-numbered or odd-numbered memory cells among the memory cells of the memory cell array 110. As aforementioned, the page buffer circuit 150 may include a plurality of page buffers PB which are coupled with the memory cell array 110 through the bit lines BL. Also, the page buffer circuit 150 may include cache buffers CB which temporarily store data received from the page buffers PB and output the data through data lines to the column decoder 160. FIG. 3 illustrates eight page buffers PB0 to PB7 and eight cache buffers CB0 to CB7 corresponding to eight bit lines BL0 to BL7. However, it is to be noted that the disclosure is not limited thereto.

The page buffers PB0 to PB7 may include even page buffers PB0, PB2, PB4 and PB6 and odd page buffers PB1, PB3, PB5 and PB7. The even page buffers PB0, PB2, PB4 and PB6 may be divided into first even page buffers PB0 and PB2 and second even page buffers PB4 and PB6, and the odd page buffers PB1, PB3, PB5 and PB7 may be divided into first odd page buffers PB1 and PB3 and second odd page buffers PB5 and PB7.

Referring to the reference symbol ①, during the half page read operation, the even page buffers PB0, PB2, PB4 and PB6 may read data from even-numbered memory cells through even bit lines BL0, BL2, BL4 and BL6, and may store the read data. When the read data are stored in the even page buffers PB0, PB2, PB4 and PB6, the control circuit 120 may control the first even page buffer PB0 and the second even page buffers PB4 among the even page buffers PB0, PB2, PB4 and PB6 to simultaneously transmit stored data through different nodes CN1 and CN2, as indicated by the reference symbol ②, and then the control circuit 120 may control the first even page buffer PB2 and the second even page buffer PB6 to simultaneously transmit stored data through different nodes CN1 and CN2.

To this end, the control circuit 120 may sequentially activate transmission signals TRAN0 and TRAN2 corresponding to the first even page buffers PB0 and PB2, and at the same time, may sequentially activate transmission signals TRAN4 and TRAN6 corresponding to the second even page buffers PB4 and PB6. The first even page buffers PB0 and PB2 and the second even page buffers PB4 and PB6 may be coupled to the different nodes CN1 and CN2, respectively.

Similarly, during the half page read operation, the odd page buffers PB1, PB3, PB5 and PB7 may read data from odd-numbered memory cells through odd bit lines BL1, BL3, BL5 and BL7, and may store the read data. When the read data are stored in the odd page buffers PB1, PB3, PB5 and PB7, the control circuit 120 may control the first odd page buffer PB1 and the second odd page buffers PB5 among the odd page buffers PB1, PB3, PB5 and PB7 to simultaneously transmit stored data through the different nodes CN1 and CN2, and then the control circuit 120 may control the first odd page buffer PB3 and the second odd page buffer PB7 to simultaneously transmit stored data through the different nodes CN1 and CN2.

To this end, the control circuit 120 may sequentially activate transmission signals TRAN1 and TRAN3 corresponding to the first odd page buffers PB1 and PB3, and at the same time, may sequentially activate transmission signals TRAN5 and TRAN7 corresponding to the second odd page buffers PB5 and PB7. The first odd page buffers PB1 and PB3 and the second odd page buffers PB5 and PB7 may be coupled to the different nodes CN1 and CN2, respectively.

Namely, the first even page buffers PB0 and PB2 and the first odd page buffers PB1 and PB3 may share a first common node CN1 among the different common nodes CN1 and CN2, and may transmit stored data to first cache buffers CB0 and CB2 and second cache buffers CB1 and CB3, respectively at different timings. The second even page buffers PB4 and PB6 and the second odd page buffers PB5 and PB7 may share the second common node CN2 among the different common nodes CN1 and CN2, and may transmit stored data to third cache buffers CB4 and CB6 and fourth cache buffers CB5 and CB7, respectively at different timings.

In various embodiments, the page buffer circuit 150 may read data from at least first and second cell groups of a single page within the memory cell array 110 during a partial read operation. For example, the first cell groups may include even-numbered memory cells coupled to bit lines BL such as even bit lines BL0, BL2, BL4 and BL6, and the second cell groups may include odd-numbered memory cells coupled to bit lines BL such as odd bit lines BL1, BL3, BL5 and BL7.

The page buffer circuit 150 may include first and second buffer groups electrically coupled to the first cell group through the bit lines BL and electrically coupled to different channels respectively including the different nodes CN1 and CN2. In other words, the first and second buffer groups may be coupled between the first cell group through the bit lines BL and different channels respectively including the different nodes CN1 and CN2.

The page buffer circuit 150 may further include third and fourth buffer groups electrically coupled to the second cell group through the bit lines BL and electrically coupled to the respective channels. In other words, the third and fourth buffer groups may be coupled between the second cell group through the bit lines BL and the respective channels.

The control circuit 120 may control the first and second buffer groups to output data of the first cell group through the corresponding channels at the same time.

The control circuit 120 may further control the third and fourth buffer groups to output data of the second cell group through the corresponding channels substantially at the same time.

The first and third buffer groups may share one channel among the different channels and may output data of the first and second cell groups, respectively at different timings.

The second and fourth buffer groups may share another one channel among the different channels and may output data of the first and second cell groups, respectively at different timings.

As described above, data read by first and second buffer groups (e.g., first even page buffers and second even page buffers during a half page read operation) or third and fourth buffer groups (e.g., first odd page buffers and second odd page buffers during the half page read operation) may be simultaneously transmitted through different nodes during a partial read operation (e.g., the half page read operation). Therefore, a time required for the partial read operation of a memory device may be reduced. Moreover, because the different nodes are shared by the first and third buffer groups (e.g., the first even and odd page buffers) at different timings and by the second and fourth buffer groups (e.g., the second even and odd page buffers) at different timings during the partial read operation, a time required for the partial read operation may be reduced without increasing a circuit area including the nodes or the load of the nodes.

Figure 4:
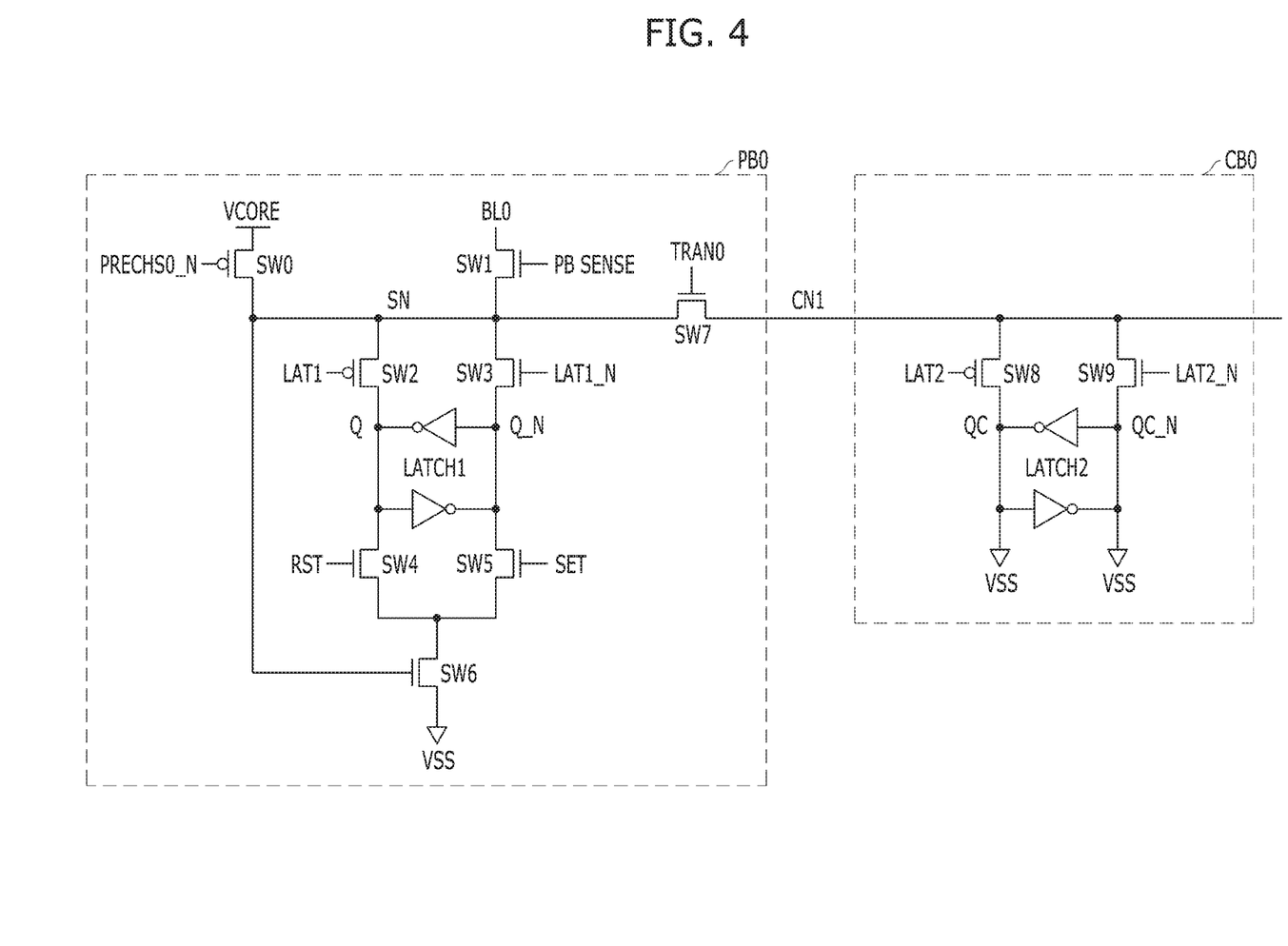
FIG. 4 is a circuit diagram illustrating a page buffer and a cache buffer illustrated in FIG. 3.

FIG. 4 is a circuit diagram illustrating a page buffer PB and a cache buffer CB illustrated in FIG. 3. The plurality of page buffers PB0 to PB7 and the plurality of cache buffers CB0 to CB7 may have the same configurations, and FIG. 4 representatively illustrates the first page buffer PB0 and the first cache buffer CB0 as an example.

The first page buffer PB0 may include a plurality of switching units SW0 to SW7 and a first latch unit LATCH1. The first cache buffer CB0 may include a plurality of switching units SW8 and SW9 and a second latch unit LATCH2. The first page buffer PB0 and the first cache buffer CB0 may be coupled through the first common node CN1.

In a precharge operation, as a precharge signal PRECHS0_N is activated to a logic low level, the first switching unit SW0 may be turned on. If the first switching unit SW0 is turned on, a core voltage VCORE may be supplied to a sensing node SN of the first page buffer PB0, and the voltage of the sensing node SN may be precharged.

In a read operation, as a coupling signal PB SENSE is activated to a logic high level, the second switching unit SW1 may be turned on. If the second switching unit SW1 is turned on, the bit line BL0 may be coupled to the first page buffer PB0. That is, depending on the potential level of the bit line BL0, the potential of the sensing node SN of the first page buffer PB0 may vary. The first page buffer PB0 may sense and store the data of the bit line BL0 based on the potential of the sensing node SN.

The first latch unit LATCH1 may latch the data of the sensing node SN. If the third switching unit SW2 is turned on in response to a first latch signal LAT1, a first node Q of the first latch unit LATCH1 may be coupled to the sensing node SN. If the fourth switching unit SW3 is turned on in response to a first inverted latch signal LAT1_N, a second node Q_N of the first latch unit LATCH1 may be coupled to the sensing node SN.

The fifth and sixth switching units SW4 and SW5 may be coupled with the first and second nodes Q and Q_N, respectively, of the first latch unit LATCH1. The fifth and sixth switching units SW4 and SW5 may be turned on in response to a reset signal RST and a set signal SET, respectively. The seventh switching unit SW6 may be turned on depending on the potential of the sensing node SN, and thereby, may couple the fifth and sixth switching units SW4 and SW5 to the terminal of a ground voltage VSS.

The first page buffer PB0 may transmit read data to the first common node CN1 in response to the transmission signal TRAN0. In other words, if the transmission signal TRAN0 is activated, the eighth switching unit SW7 may be turned on, and the sensing node SN may be coupled to the first common node CN1.

The second latch unit LATCH2 may latch the data of the first common node CN1. In response to a second latch signal LAT2 and a second inverted latch signal LAT2_N, the ninth switching unit SW8 and the tenth switching unit SW9 may operate, and data may be latched to a third node QC and a fourth node QC_N. Depending on the column select signal Y1 generated by the column decoder 150, the third node QC and the fourth node QC_N may be coupled to an input/output terminal, and thereby, the latched data may be outputted.

The page buffer circuit 150 may operate under the control of the control circuit 120. Thus, the signals described above may be included in the page buffer control signal PB_CONTROL which is inputted by being generated by the control circuit 120.

Figure 5:
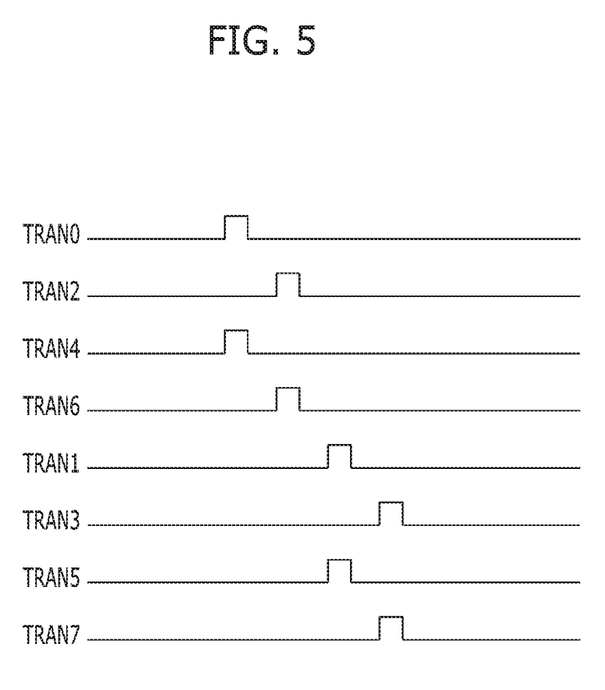
FIG. 5 is a timing diagram illustrating the signals of the page buffer circuit illustrated in FIG. 1.

FIG. 5 is a timing diagram illustrating the signals of the page buffer circuit 150 illustrated in FIG. 1.

During the half page read operation, the even page buffers PB0, PB2, PB4 and PB6 may read data through the even bit lines BL0, BL2, BL4 and BL6, respectively. If data are read by the even page buffers PB0, PB2, PB4 and PB6, the control circuit 120 may sequentially activate first transmission signals TRAN0 and TRAN2 corresponding to the first even page buffers PB0 and PB2, and at the same time, may sequentially activate second transmission signals TRAN4 and TRAN6 corresponding to the second even page buffers PB4 and PB6.

As illustrated in FIG. 5, the first transmission signals TRAN0 and TRAN2 are sequentially activated, then at the same time, the second transmission signals TRAN4 and TRAN6 may be sequentially activated. According to this fact, the first page buffer PB0 and the fifth page buffer PB4 may transmit read data to the first common node CN1 and the second common node CN2, respectively. In succession, the third page buffer PB2 and the seventh page buffer PB6 may transmit read data to the first common node CN1 and the second common node CN2, respectively.

While it is illustrated in FIG. 5 that the first transmission signals TRAN0 and TRAN2 and the second transmission signals TRAN4 and TRAN6 are simultaneously activated, it is to be noted that the disclosure is not limited thereto. For example, according to another embodiment of the disclosure, a same signal may be used as the first transmission signals TRAN0 and TRAN2 and the second transmission signals TRAN4 and TRAN6.

If data are read by the even page buffers PB0, PB2, PB4 and PB6, in succession, the odd page buffers PB1, PB3, PB5 and PB7 may read data through the odd bit lines BL1, BL3, BL5 and BL7. If data are read by the odd page buffers PB1, PB3, PB5 and PB7, the control circuit 120 may sequentially activate third transmission signals TRAN1 and TRAN3 corresponding to the first odd page buffers PB1 and PB3, and at the same time, may sequentially activate fourth transmission signals TRAN5 and TRAN7 corresponding to the second odd page buffers PB5 and PB7.

Namely, the third transmission signals TRAN1 and TRAN3 are sequentially activated, and at the same time, the fourth transmission signals TRAN5 and TRAN7 may be sequentially activated. According to this fact, the second page buffer PB1 and the sixth page buffer PB5 may transmit read data to the first common node CN1 and the second common node CN2, respectively. In succession, the fourth page buffer PB3 and the eighth page buffer PB7 may transmit read data to the first common node CN1 and the second common node CN2, respectively.

As described above, during the half page read operation, data may be read to the even page buffers PB0, PB2, PB4 and PB6 through the even bit lines BL0, BL2, BL4 and BL6 from memory cells. For example, if data are read from memory cells and are stored in the first and fifth page buffers PB0 and PB4, the first and fifth page buffers PB0 and PB4 may simultaneously transfer the stored data to the first and fifth cache buffers C130 and CB4, respectively.

Depending on a half page read operation, only an even page read operation may be performed, or an odd page read operation may be successively performed. In the case where an odd page read operation is performed, data may be read to the odd page buffers PB1, PB3, PB5 and PB7 through the odd bit lines BL1, BL3, BL5 and BL7. For example, if data are read from memory cells and are stored in the second and sixth page buffers PB1 and PB5, the second and sixth page buffers PB1 and PB5 may simultaneously transfer the stored data to the second and sixth cache buffers CB1 and CB5, respectively.

That is, the even page buffers PB0 and PB4 or the odd page buffers PB1 and PB5 which read data by performing together a half page read operation may simultaneously transfer the read data through different nodes.

In various embodiments, during a partial read operation, the first and second buffer groups may buffer data from the first cell group.

Then, the control circuit 120 may sequentially enable a first control signal group corresponding to the first buffer group, and at the same time, may sequentially enable a second control signal group corresponding to the second buffer group.

In response to the first and second control signal groups, the first and second buffer groups may output the buffered data to the different channels, respectively, at the same time.

In various embodiments, during the partial read operation, the third and fourth buffer groups may buffer data from the second cell group.

Then, the control circuit 120 may sequentially enable a third control signal group corresponding to the third buffer group, and at the same time, may sequentially enable a fourth control signal group corresponding to the fourth buffer group.

In response to the third and fourth control signal groups, the third and fourth buffer groups may output the buffered data to the different channels, respectively, at the same time.

In accordance with an embodiment of the present invention, the first and second buffer groups may buffer data from the first cell group through the partial read operation and may simultaneously output the buffered data to the different channels.

In accordance with an embodiment of the present invention, the third and fourth buffer groups may buffer data from the second cell group through the partial read operation and may simultaneously output the buffered data to the different channels.

In accordance with an embodiment of the present invention, the first and second buffer groups and the corresponding channel may be involved with the partial read operation, and then the third and fourth buffer groups and the corresponding channel may be optionally involved with the partial read operation depending on a situation.

Figure 6:
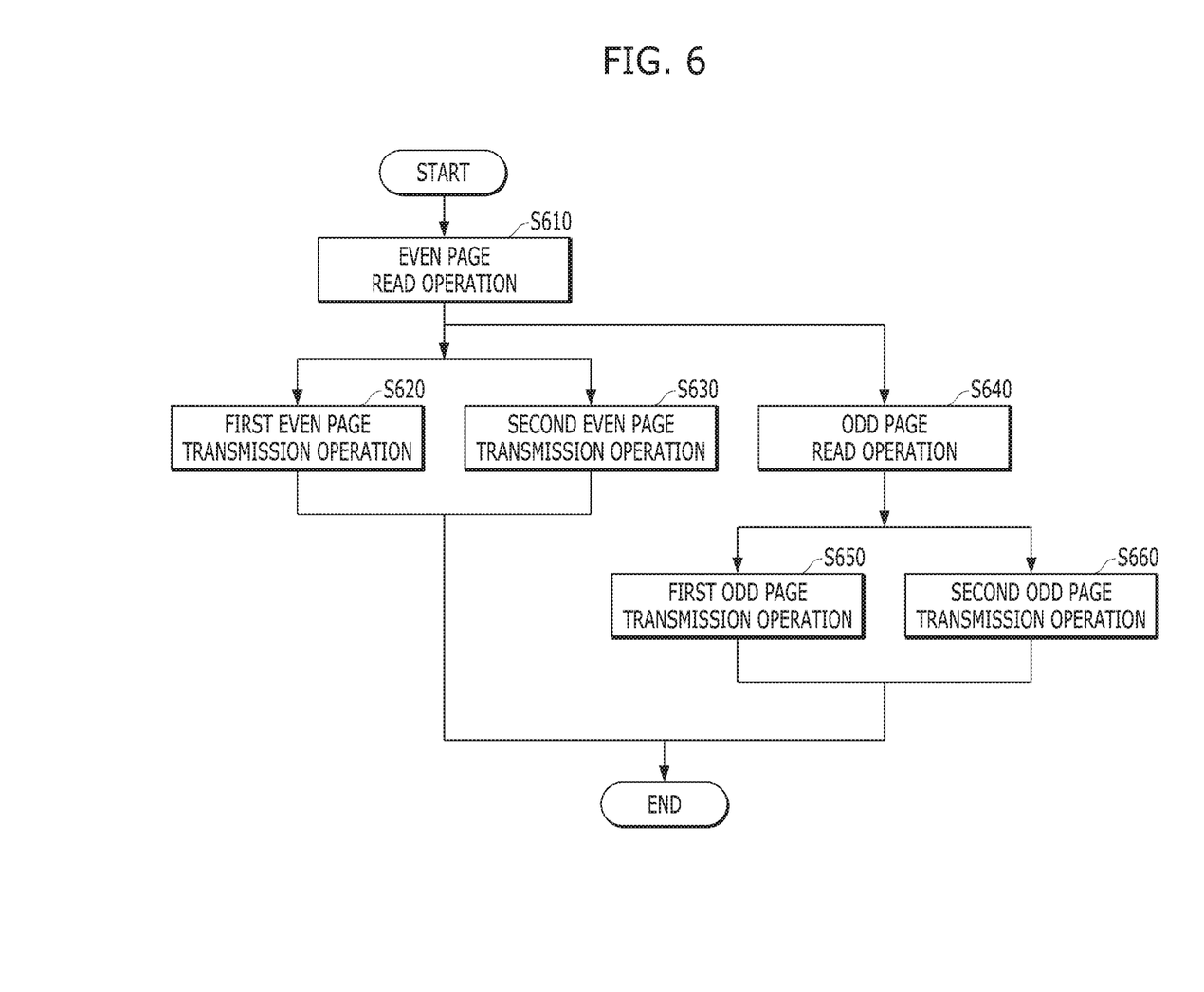
FIG. 6 is a flow chart illustrating an operation of a memory device in accordance with the embodiment of the disclosure.

FIG. 6 is a flow chart illustrating an operation of a memory device (e.g., the memory device 100 of FIG. 1) in accordance with the embodiment of the disclosure.

1) An Even Page Read Operation (S610)

During the half page read operation, the control circuit 120 may read data through the even bit lines BL0, BL2, BL4 and BL6 among the plurality of bit lines BL0 to BL7. The read data may be stored in the even page buffers PB0, PB2, PB4 and PB6, respectively.

During the partial read operation, the first and second buffer groups may buffer data from the first cell group.

2) First and Second Even Page Transmission Operations (S620 and S630)

If the data are stored in the even page buffers PB0, PB2, PB4 and PB6, the control circuit 120 may sequentially transmit the data stored in the first even page buffers PB0 and PB2 and at the same time, may sequentially transmit the data stored in the second even page buffers PB4 and PB6. To this end, the control circuit 120 may sequentially activate the first transmission signals TRAN0 and TRAN2 corresponding to the first even page buffers PB0 and PB2, and at the same time, may sequentially activate the second transmission signals TRAN4 and TRAN6 corresponding to the second even page buffers PB4 and PB6.

In response to the first transmission signals TRAN0 and TRAN2 which are activated, the first even page buffers PB0 and PB2 may sequentially transmit the stored data to the first common node CN1. Moreover, in response to the second transmission signals TRAN4 and TRAN6 which are activated, the second even page buffers PB4 and PB6 may sequentially transmit the stored data to the second common node CN2.

During the partial read operation, the control circuit 120 may sequentially enable the first control signal group corresponding to the first buffer group, and at the same time, may sequentially enable the second control signal group corresponding to the second buffer group. In response to the first and second control signal groups, the first and second buffer groups may output the buffered data to the different channels, respectively, at the same time.

3) An Odd Page Read Operation (S640)

After the even page read operation step S610, the control circuit 120 may read data through the odd bit lines BL1, BL3, BL5 and BL7 among the plurality of bit lines BL0 to BL7. The read data may be stored in the odd page buffers PB1, PB3, PB5 and PB7, respectively.

During the partial read operation, the third and fourth buffer groups may buffer data from the second cell group.

4) First and Second Odd Page Transmission Operations (S650 and S660)

If the data are stored in the odd page buffers PB1, PB3, PB5 and PB7, the control circuit 120 may sequentially transmit the data stored in the first odd page buffers PB1 and PB3, and at the same time, may sequentially transmit the data stored in the second odd page buffers PB5 and PB7. To this end, the control circuit 120 may sequentially activate the third transmission signals TRAN1 and TRAN3 corresponding to the first odd page buffers PB1 and PB3, and at the same time, may sequentially activate the fourth transmission signals TRAN5 and TRAN7 corresponding to the second odd page buffers PB5 and PB7.

In response to the third transmission signals TRAN1 and TRAN3 which are activated, the first odd page buffers PB1 and PB3 may sequentially transmit the stored data to the first common node CN1. Moreover, in response to the fourth transmission signals TRAN5 and TRAN7 which are activated, the second odd page buffers PB5 and PB7 may sequentially transmit the stored data to the second common node CN2.

During the partial read operation, the control circuit 120 may sequentially enable the third control signal group corresponding to the third buffer group, and at the same time, may sequentially enable the fourth control signal group corresponding to the fourth buffer group. In response to the third and fourth control signal groups, the third and fourth buffer groups may output the buffered data to the different channels, respectively, at the same time.

According to the embodiment of the disclosure, even (or odd) page buffers which perform a half page read operation may share lines with remaining odd (or even) page buffers, and may transmit read data in parallel based on the shared lines without increasing the number of lines. Therefore, a time required for a read operation may be reduced without increasing the circuit area or operation load of a memory device.

According to the embodiment of the disclosure, data buffered by the first and second buffer groups or the third and fourth buffer groups may be output through different channels at the same time during a partial read operation. The different channels are shared by the first and third buffer groups at different timings and by the second and fourth buffer groups at different timings during the partial read operation, a time required for the partial read operation may be reduced without increasing a circuit area.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a memory cell array including a plurality of memory cells;
   a page buffer circuit suitable for reading data from even-numbered memory cells among the memory cells during a half page read operation, the page buffer circuit including a first group of even page buffers and a second group of even page buffers which store the data read from the even-numbered memory cells; and
   a control circuit suitable for controlling the first group of even page buffers to sequentially transmit the stored data through a first node and simultaneously controlling the second group of even page buffers to sequentially transmit the stored data through a second node which is different from the first node,
   wherein the page buffer circuit further includes first cache buffers suitable for storing data transmitted through the first node from the first group of even page buffers and third cache buffers suitable for storing data transmitted through the second node from the second group of even page buffers.

2. The memory device according to claim 1, wherein the page buffer circuit further reads data from odd-numbered memory cells among the memory cells during the half page read operation, and the page buffer circuit further includes a first group of odd page buffers and a second group of odd page buffers which store the data read from the odd-numbered memory cells.

3. The memory device according to claim 2, wherein the control circuit controls the first group of odd page buffers to sequentially transmit the stored data through the first node and simultaneously controls the second group of odd page buffers to sequentially transmit the stored data through the second node.

4. The memory device according to claim 3, wherein the page buffer circuit further includes:
   second cache buffers suitable for storing data transmitted through the first node from the first group of odd page buffers; and
   fourth cache buffers suitable for storing data transmitted through the second node from the second group of odd page buffers.

5. The memory device according to claim 1, wherein the control circuit provides a first transmission signal to control the first group of even page buffers and the second group of even page buffers.

6. The memory device according to claim 3, wherein the control circuit further provides a second transmission signal to control the first group of odd page buffers and the second group of odd page buffers.

7. A memory device comprising:
   a memory cell array including a plurality of memory cells;
   a plurality of first even page buffers suitable for reading data from first even-numbered memory cells among the plurality of memory cells, and storing the read data;
   a plurality of first odd page buffers suitable for reading data from first odd-numbered memory cells among the plurality of memory cells, and storing the read data;
   a plurality of first cache buffers corresponding to the first even page buffers, and suitable for storing data received through a first common node from the first even page buffers; and
   a plurality of second cache buffers corresponding to the first odd page buffers, and suitable for storing data received through the first common node from the first odd page buffers.

8. The memory device according to claim 7, further comprising:
   a plurality of second even page buffers suitable for reading data from second even-numbered memory cells among the plurality of memory cells, and storing the read data;
   a plurality of second odd page buffers suitable for reading data from second odd-numbered memory cells among the plurality of memory cells, and storing the read data;
   a plurality of third cache buffers corresponding to the second even page buffers, and suitable for storing data received through a second common node from the second even page buffers; and
   a plurality of fourth cache buffers corresponding to the second odd page buffers, and suitable for storing data received through the second common node from the second odd page buffers.

9. The memory device according to claim 8, wherein the first and second even page buffers read data from the first and second even-numbered memory cells during a half page read operation, and store the read data.

10. The memory device according to claim 9, wherein the first even page buffers sequentially transmit data read from the first even-numbered memory cells, to the first common mode, at the same time when the second even page buffers sequentially transmit data read from the second even-numbered memory cells, to the second common node.

11. The memory device according to claim 9, wherein the first and second even page buffers read data from the first and second even-numbered memory cells, and the first and second odd page buffers read data from the first and second odd-numbered memory cells.

12. The memory device according to claim 11, wherein the first odd page buffers sequentially transmit data read from the first odd-numbered memory cells, to the first common mode, at the same time when the second odd page buffers sequentially transmit data read from the second odd-numbered memory cells, to the second common node.

13. A method for operating a memory device, the method comprising:
   reading data through even bit lines among a plurality of bit lines and storing the read data in even page buffers, during a half page read operation; and
   sequentially transmitting data stored in first even page buffers among the even page buffers to a first common node while sequentially transmitting data stored in second even page buffers among the even page buffers to a second common node,
   wherein the first even page buffers transmit stored data to first cache buffers through the first common node and the second even page buffers transmit stored data to third cache buffers through the second common node.

14. The method according to claim 13, wherein the sequentially transmitting of the data stored in the first even page buffers and the second even page buffers comprises:
   sequentially activating first transmission signals corresponding to the first even page buffers while sequentially activating second transmission signals corresponding to the second even page buffers.

15. The method according to claim 14, wherein the sequentially transmitting of the data stored in the first even page buffers and the second even page buffers further comprises:
   sequentially transmitting the data stored in the first even page buffers, to the first common node, in response to the first transmission signals; and
   sequentially transmitting the data stored in the second even page buffers, to the second common node, in response to the second transmission signals.

16. The method according to claim 15, further comprising, after the storing of the read data in the even page buffers:
   reading data through odd bit lines among the plurality of bit lines, and storing the read data in odd page buffers, during the half page read operation; and
   sequentially transmitting data stored in first odd page buffers among the odd page buffers while sequentially transmitting data stored in second odd page buffers among the odd page buffers.

17. The method according to claim 16, wherein the sequentially transmitting of the data stored in the first odd page buffers and the second odd page buffers comprises:
   sequentially activating third transmission signals corresponding to the first odd page buffers while sequentially activating fourth transmission signals corresponding to the second odd page buffers.

18. The method according to claim 17, wherein the sequentially transmitting of the data stored in the first odd page buffers and the second odd page buffers further comprises:
   sequentially transmitting the data stored in the first odd page buffers, to the first common node, in response to the third transmission signals; and
   sequentially transmitting the data stored in the second odd page buffers, to the second common node, in response to the fourth transmission signals.

19. The method according to claim 18, wherein the first odd page buffers transmit stored data to second cache buffers through the first common node.

20. The method according to claim 18, wherein the second odd page buffers transmit stored data to fourth cache buffers through the second common node.

* * * * *